(12) United States Patent
Behr et al.

(10) Patent No.: US 12,395,170 B2
(45) Date of Patent: Aug. 19, 2025

(54) CIRCUIT ARRANGEMENT AND METHOD FOR ACTUATING A POWER SWITCH

(71) Applicant: SEMIKRON DANFOSS ELEKTRONIK GMBH & CO. KG, Nuremberg (DE)

(72) Inventors: Oliver Behr, Nuremberg (DE); Günter Katzenberger, Würzburg (DE); Gunter Königsmann, Langensendelbach (DE); Daniel Obernöder, Iphofen (DE)

(73) Assignee: SEMIKRON DANFOSS ELEKTRONIK GMBH & CO. KG, Nuremberg (DE)

( * ) Notice: Subject to any disclaimer, the term of this patent is extended or adjusted under 35 U.S.C. 154(b) by 81 days.

(21) Appl. No.: 18/386,982

(22) Filed: Nov. 3, 2023

(65) Prior Publication Data

US 2024/0162900 A1 May 16, 2024

(30) Foreign Application Priority Data

Nov. 14, 2022 (DE) .................. 10 2022 130 027.7

(51) Int. Cl.
*H03K 17/567* (2006.01)
*H03K 17/687* (2006.01)

(52) U.S. Cl.
CPC ......... *H03K 17/687* (2013.01); *H03K 17/567* (2013.01)

(58) Field of Classification Search
CPC ............................ H03K 17/567; H03K 17/687
USPC .................................................. 327/108, 109
See application file for complete search history.

(56) References Cited

U.S. PATENT DOCUMENTS

2014/0015501 A1* 1/2014 Youn ................. H02M 3/158
323/272
2024/0146179 A1* 5/2024 Ochi ................... H02M 1/08

FOREIGN PATENT DOCUMENTS

DE          102022104700 A1      9/2022

OTHER PUBLICATIONS

DE 10 2022 130 027,7, German Search Report dated Sep. 9, 2023, 6 pages—German; 6 pages—English.
A self-adaptive blanking time circuit for fast IGBT de-saturation short-circuit protection, by Hongyne, Xinhong, Yifei, Dawel, Tiantian and Zhenwei, IEICE Electronics Express, vol. 17, No. 11. 1-6, Copyright © 2020 The Institute of Electronics, Informatio and Communcation Engineers, pp. 1-6.
(Continued)

*Primary Examiner* — William Hernandez
(74) *Attorney, Agent, or Firm* — Andrew F. Young, Esq; NOLTE LACKENBACH SIEGEL

(57) ABSTRACT

A circuit arrangement and a method for actuating a power semiconductor switch wherein said power semiconductor switch has a load current input, a load current output and a control input, having a first voltage detection device, which is able to be switched on and off, for detecting a first voltage present between the load current input and the load current output, a second voltage detection device, which is able to be switched on and off, for detecting a second voltage present between the control input and the load current output, and having a regulating device that is designed to cyclically assess a second voltage value of the second voltage and, if a second threshold value of the second voltage value is reached, to switch on the first voltage detection device, in particular if no further fault signal is present.

12 Claims, 3 Drawing Sheets

(56) References Cited

OTHER PUBLICATIONS

A new combined $V_{GE}$ and $V_{CE}$ based short-circuit detection for high-$I_{c,desat}$ HV-IGBTs and RC-IGBTs, by Cunha, Fuhrmann, Lexow, Hammes, Eckel, PCIM Europe 2018, Jun. 5-7, 2018, Nuremberg, Germany, ISBN 978-3-8007-4646-0, © VDE VERI AG GMBH, Berlin, Offenbach, pp. 825-832.

* cited by examiner

CIRCUIT ARRANGEMENT AND METHOD FOR ACTUATING A POWER SWITCH

CROSS REFERENCE TO RELATED APPLICATIONS

This application relates to and claims priority to DE 10 2022 130 027.7 filed Nov. 14, 2023, the entire contents of which are incorporated herein fully by reference.

FIGURE SELECTED FOR PUBLICATION

FIG. 2.

BACKGROUND OF THE INVENTION

Field of the Invention

The invention describes a circuit arrangement and a switching device therewith for actuating a power semiconductor switch, wherein said power semiconductor switch has a load current input, a load current output and a control input, comprising a first voltage detection device, which is able to be switched on and off, for detecting a first voltage present between the load current input and the load current output, a second voltage detection device, which is able to be switched on and off, for detecting a second voltage present between the control input and the load current output. The invention further describes a method for using such a switching device.

Description of the Related Art

DE 10 2022 104 700 A1 discloses circuits and techniques for protecting a power switch when the power is switched ON. A driver circuit can ascertain whether the power switch is in a desaturation mode or an overcurrent state based on a signal at a detection pin, and deactivate the power switch in response to the finding that the power switch is in the desaturation mode or overcurrent state. In addition, the driver circuit can ascertain whether the power switch is moving toward a limit value for the safe operating area (SOA) of the power switch based on a rate of change of the signal, and deactivate the power switch in response to the finding that the power switch is moving toward the SOA limit value.

ASPECTS AND OBJECTS OF THE INVENTION

At least one of the objects of the present invention is to provide an improvement over the related art.

According to one alternative aspect of the present invention, there is provided a circuit arrangement and a method for actuating a power semiconductor switch wherein said power semiconductor switch has a load current input, a load current output and a control input, having a first voltage detection device, which is able to be switched on and off, for detecting a first voltage present between the load current input and the load current output, a second voltage detection device, which is able to be switched on and off, for detecting a second voltage present between the control input and the load current output, and having a regulating device that is designed to cyclically assess a second voltage value of the second voltage and, if a second threshold value of the second voltage value is reached, to switch on the first voltage detection device, in particular if no further fault signal is present.

The invention is based on the object of proposing both a method and a circuit arrangement that improves the protection of a power switch, in particular during the switching-on process.

This object is achieved according to the invention by a circuit arrangement for actuating a power semiconductor switch, wherein said power semiconductor switch has a load current input, a load current output and a control input, comprising a first voltage detection device, which is able to be switched on and off, for detecting a first voltage present between the load current input and the load current output, a second voltage detection device, which is able to be switched on and off, for detecting a second voltage present between the control input and the load current output, and comprising a regulating device that is designed to cyclically assess a second voltage value of the second voltage and, if a second threshold value of the second voltage value is reached, to switch on the first voltage detection device, in particular if no further fault signal is present.

In one preferred configuration, a part of the second voltage detection device is in the form of an integrated circuit and this part has a digitizing device, in particular an analogue-to-digital converter, which digitizes the second voltage value. In this case, it is further preferred if the regulating device is likewise at least partially arranged in the integrated circuit.

The object is further achieved according to the invention by a switching device having such a circuit arrangement and comprising a power switch that is in the form of a power semiconductor component or of a group of power semiconductor components connected in parallel, wherein the respective power semiconductor component is in form of an IGBT or a MOSFET, in particular of a SiC MOSFET.

It may be advantageous for two power switches that each have an assigned circuit arrangement to be arranged in a half-bridge topology.

The object is further achieved by a method for operating a circuit arrangement as part of a switching device, wherein a second voltage value of the second voltage is determined by means of the second voltage detection device during the switching-on process of the power semiconductor switch, wherein this second voltage value is cyclically compared with a static or dynamic second threshold value and, wherein, if this second threshold value is reached, the first voltage detection device is switched on, in particular if no further fault signal is present.

It may also be preferred for the second voltage detection device to be switched on only after a static or dynamic first waiting time after the start of the switching-on process of the power switch.

It may also be preferred for the first voltage detection device to be switched on only after a static or dynamic second waiting time after the second threshold value has been reached. It is advantageous in this case for the second threshold value to be between 90% and 98%, in particular between 92% and 95%, of a target value of the second voltage.

It may be particularly advantageous, if the target value of the second voltage is exceeded by an exceedance value, for the power switch to be switched to the off state by means of an output stage of the control device and a fault signal to be generated. In this case, it may be particularly advantageous for the exceedance value to be 5%, in particular 10%, above the target value of the second voltage. It may also be advantageous for the power switch to be switched to the off state after a static or dynamic third waiting time. The dynamic third waiting time can in particular depend on the second voltage value itself.

Of course, unless this is explicitly excluded or excluded per se or contradicts the concept of the invention, the features mentioned in the singular in each case, in particular the second voltage detection device, can be present several times in the arrangement according to the invention.

It goes without saying that the various configurations of the invention, regardless of whether they are mentioned in connection with the circuit arrangement or the switching device or with the methods, can be realized individually or in any combinations in order to achieve improvements. In particular, the features mentioned and explained above and hereinafter can be used not only in the combinations indicated, but also in other combinations or by themselves, without departing from the scope of the present invention.

Further explanations of the invention, advantageous details and features are apparent from the following description of the exemplary embodiments of the invention schematically illustrated in the figures, or of respective parts thereof.

The above and other aspects, features, objects, and advantages of the present invention will become apparent from the following description read in conjunction with the accompanying drawings for exemplary but nonlimiting embodiments, in which like reference numerals designate the same elements.

DETAILED DESCRIPTION OF THE PREFERRED EMBODIMENTS

Figure 1:
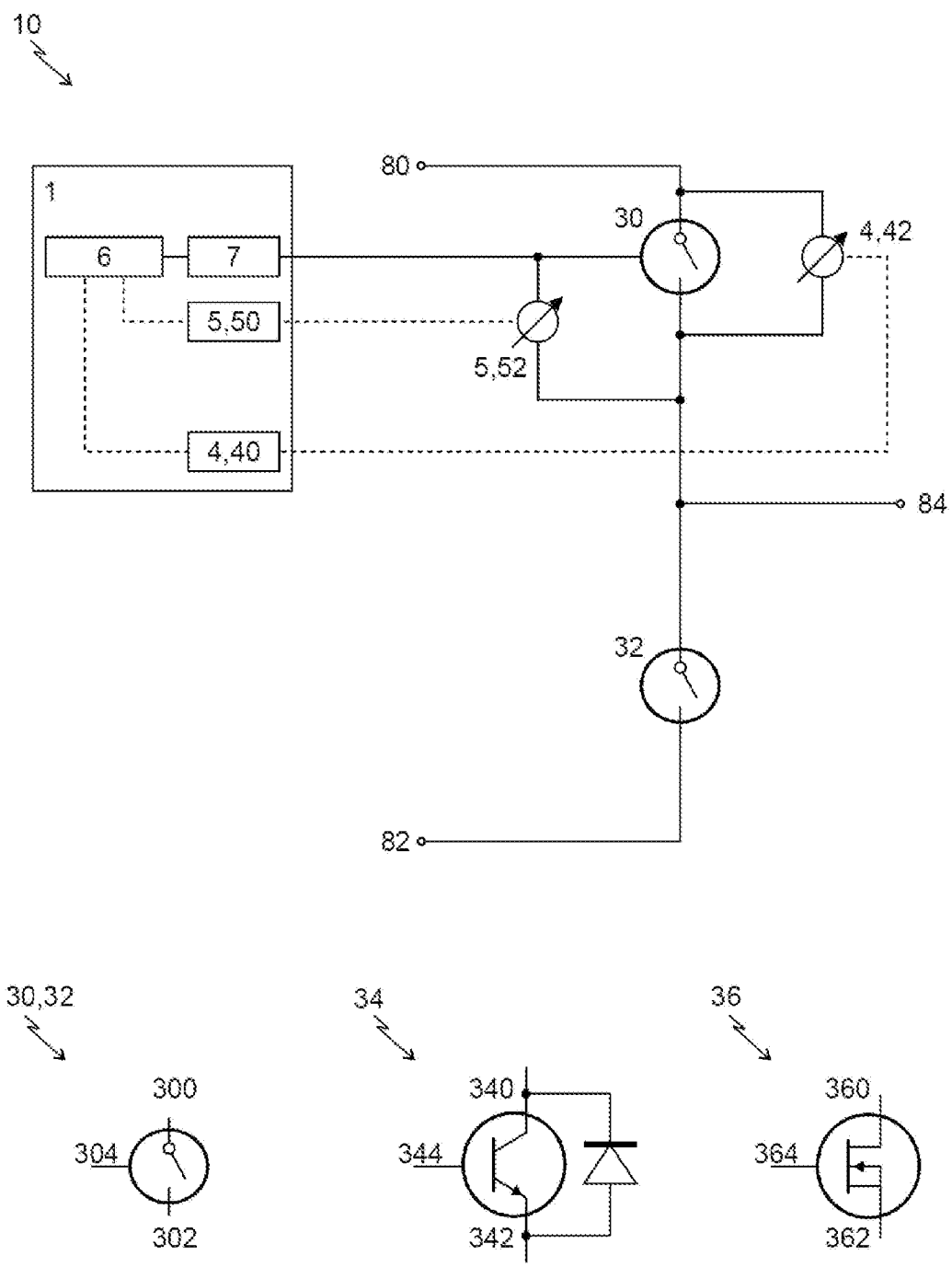
FIG. 1 shows a switching device according to the invention having a circuit arrangement according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Referring to all the figures herein, FIG. 1 shows a switching device 10 according to the invention having a circuit arrangement 1 according to the invention. The switching device 10 comprises a half-bridge circuit, which is conventional in the art, of two power switches 30, 32, each comprising a load current input 300, a load current output 302 and a control input 304. The first, upper power switch 30 is connected to a first DC voltage connection 80 of positive polarity by way of its load current input 300, whereas the second, lower power switch 32 is connected to a second DC voltage connection 82 of negative polarity by way of its load current output 302. The centre tap between the two power switches 30, 32 forms the AC voltage connection 84.

Each of these power switches 30, 32 is designed conventionally in the art. Purely by way of example, the respective power switch 30, 32 can be in the form of an IGBT 34, with a freewheeling diode connected in antiparallel, or in the form of a power MOSFET 36, both in silicon and in silicon carbide technology. Likewise, the respective power switch 30, 32 can be a parallel connection of the components respectively mentioned. In the case of an IGBT 34, the collector connection 340 forms the load current input 300, while the emitter connection 342 forms the load current output 302. In the case of a MOSFET 36, the drain connection 360 forms the load current input 300, while the source connection 362 forms the load current output 302. The respective gate connection 344, 364 forms the control input 304.

The circuit arrangement 1 comprises a first voltage detection device 4, which has a first voltage detection element 42 and an evaluation circuit 40, which here is in the form of an integrated circuit. The voltage detection element 42 detects the voltage dropped across the power switch 30 between the load current input 300 thereof and the load current output 302 thereof. The evaluation circuit 40, and therefore the integrated circuit, further forms a part of an actuation circuit of the power switch 30. Depending on switching commands for the assigned power switch 30 and possibly further parameters, the entire first voltage detection device 4 is designed to be able to be switched on and off, i.e., to be able to be activated and deactivated. First voltage detection devices 4 of this kind are also known from the prior art as what are referred to as "VCE monitoring circuits".

The circuit arrangement 1 shown also has a second voltage detection device 5, which has a second voltage detection element 52 and an evaluation circuit 50, which here is likewise in the form of an integrated circuit. The second voltage detection element 52 detects the voltage dropped across the power switch 30 between the load current input 304 thereof and the load current output 302 thereof. The evaluation circuit, and therefore the integrated circuit, likewise forms a part of the actuation circuit of the power switch 30. The entire second voltage detection device 5 is likewise designed to be able to be switched on and off, i.e., to be able to be activated and deactivated.

Figure 2:
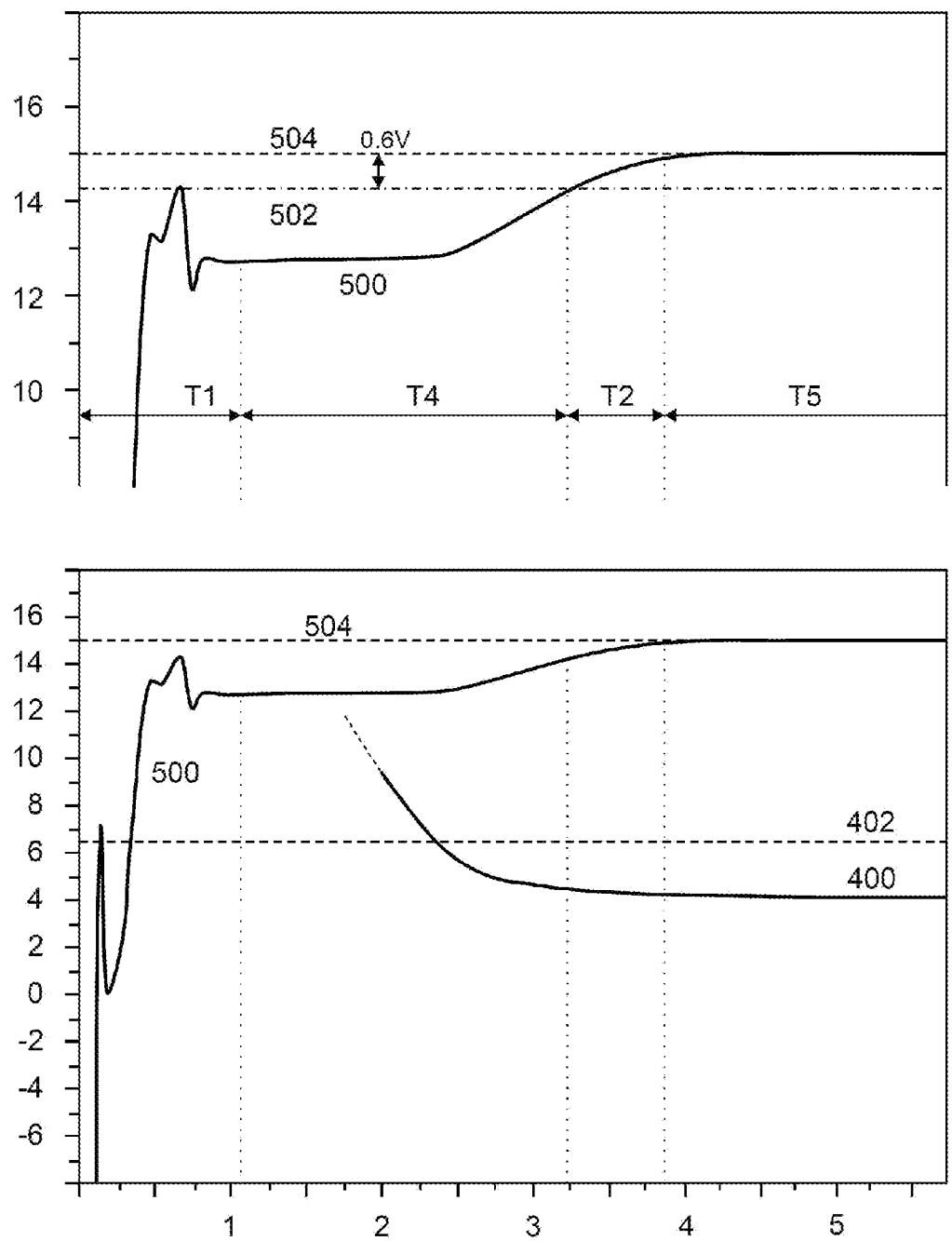
FIG. 2 shows voltage profiles upon application of a configuration of the method according to the invention.
Figure 3:
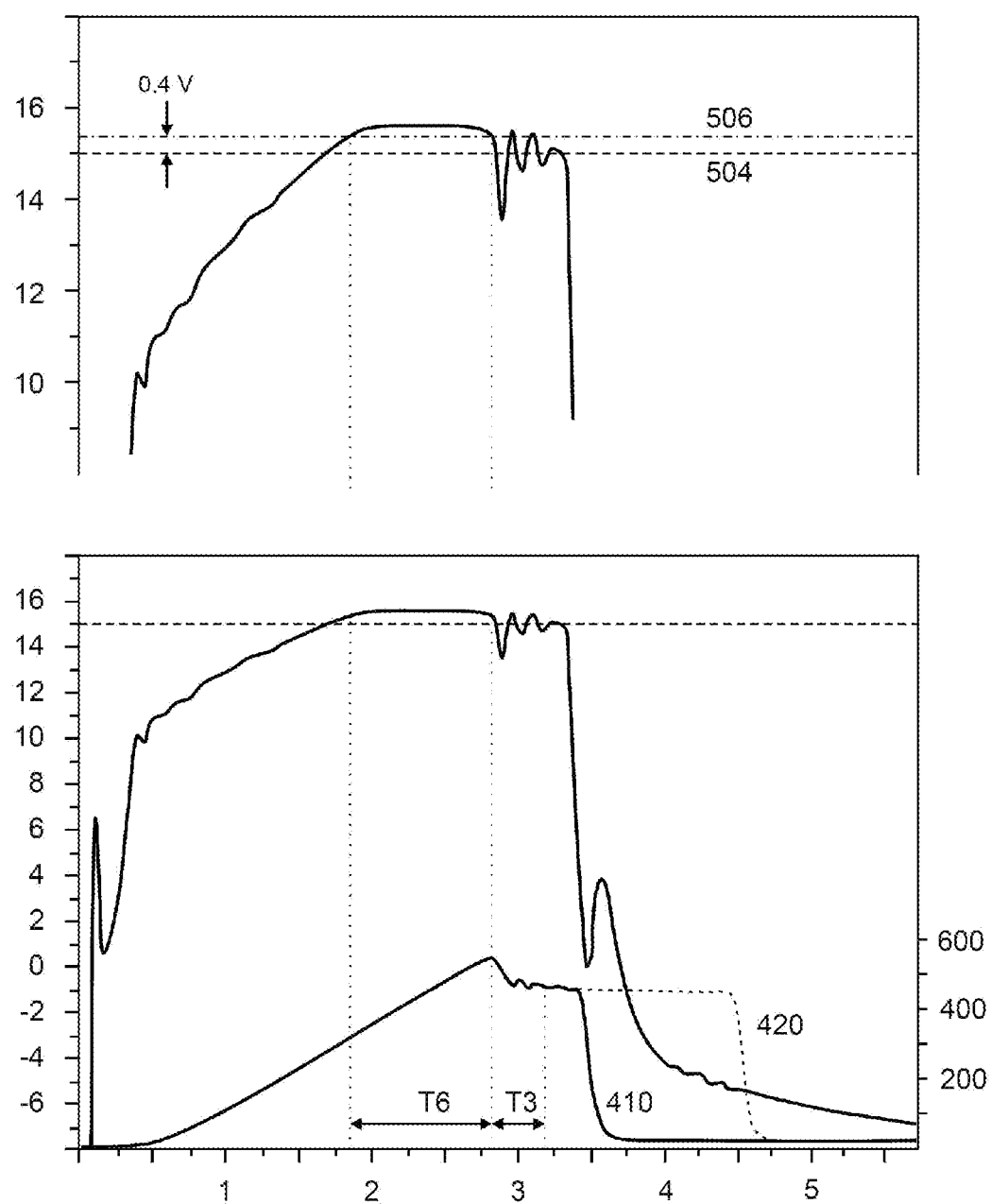
FIG. 3 shows voltage profiles upon application of a further configuration of the method according to the invention.

The circuit arrangement 1 furthermore has a regulating device 6 that, cf. FIGS. 2 and 3 et al, is designed to cyclically assess a second voltage value of the second voltage 500 and, if a second threshold value 502 of the second voltage 500 is reached, to switch on the first voltage detection device 4, in particular if no further fault signal is present. The switching itself is carried out by means of the output stage 7, which is conventional in the art and is designed to apply to the control input 304 of the power switch 30 the voltage necessary for the purpose of switching on or switching off. Advantageously, various components, in particular the two evaluation circuits 40, 50 and the regulating device 6 are part of a common integrated circuit.

FIG. 2 shows voltage profiles upon application of a configuration of the method according to the invention. The profile of the first voltage 400 during the switching-on process of a power switch 30, for example according to FIG.

1, is shown. The profile of the second voltage 500 during the switching-on process is also shown. In the lower part of the figure, the entire range that the second voltage 500 can assume between control input 300 and load current output 302, in this case from −7 V to +15 V, is shown, whereas in the upper part of the figure, only an extract for voltages between +9 V and +15 V is shown. It goes without saying that the respective temporal profile is identical in the upper part and in the lower part.

The respective voltage profiles are temperature-dependent at least in so far as the respective profile of the voltage curves is extended to longer periods of time as the temperature of the power switch 30 increases.

The voltage profile of the first voltage 400 is shown, which falls below an assigned first threshold value 402 after a first time period, which is, amongst other things, dependent on the temperature of the power switch 30. In some applications, it is conventional in the art to switch on, i.e., activate the first voltage detection device 4 only as soon as the value of the first voltage 400 is below this first threshold value 402. In this case it is customary to set a fixed waiting time that is conventional in the art and during which the value of the first voltage 400 is safely below this first threshold value 402. In the time window from the start of the switching-on process to the first threshold value 402 being safely fallen below, there is no check for an overload, in particular for a short circuit, of the power switch 30.

It is also preferred to be able to dynamically design the waiting time until the activation of the first voltage detection device 4 in a simple way. According to the invention, the second voltage detection device 5 is used for this purpose. Said second voltage detection device is switched on, that is to say activated, after a first waiting time T1 that is significantly shorter than the waiting time that is conventional in the art. After the activation of the second voltage detection device 5, the second voltage 500 is monitored thereby, and after the period T4 and if a second threshold value 502 is reached, which in this case is 600 mV below the target value 504 of the second voltage 500 of +15 V, the first voltage detection device 4 is activated. It may be advantageous to again provide a second waiting time T2 before the active switching, which should, however, be as short as possible, in order to be able to activate the first voltage detection device 4 at the earliest expedient time. This first voltage detection device 4 is then active for a period T5 until a shutdown of the power switch 30 is initiated.

In the simplest case, the respective waiting time T1, T2 can be selected statically, i.e., can always cover the same time period. However, it is preferred to dynamically select the respective waiting time T1, T2, wherein, purely by way of example, the temperature of the power switch 30 is added as a correction factor to a fixed waiting time.

FIG. 3 shows voltage profiles upon application of a further configuration of the method according to the invention. In this case, the representation is fundamentally the same as in FIG. 2.

However, the second voltage detection device 5 ascertains a voltage value of the second voltage 500 of more than +15.4 V. The exceedance of this exceedance value 506 results from a short circuit of the bridge circuit and is therefore consequentially interpreted, preferably by means of the regulating device 6, as a fault and generates a fault signal. After a period T6 has elapsed, this fault signal then causes the control device 1 to switch the power switch 30 to the off state by means of the output stage 7, cf. FIG. 2. This switching process takes place only as soon as the second voltage 500 has again fallen below the exceedance value 506 after the time interval T6. In addition, this switching process is preferably carried out only after a further third waiting time T3 has elapsed. This third waiting time T3 can be determined statically, but preferably dynamically, just like the first and the second waiting time.

The temporal profile of the current 410 through the power switch 30 and its decay after the switch-off is also shown. The dashed line shows the profile of the current 420 if only a first voltage detection device 4 had been present, and if this were to have switched the power switch 30 to the off state only later than in the presence of the second voltage detection device 5.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. A circuit arrangement, for actuating a power semiconductor switch, wherein:
    said power semiconductor switch has a load current input, a load current output and a control input;
    said circuit arrangement, further comprising:
        a first voltage detection device, which is able to be switched on and off, for detecting a first voltage present between the load current input and the load current output;
        a second voltage detection device, which is able to be switched on and off, for detecting a second voltage present between the control input and the load current output; and
        a regulating device that is designed to cyclically assess a second voltage value of the second voltage and, if a second threshold value of the second voltage value is reached, to switch on the first voltage detection device, if a fault signal is not present.

2. The circuit arrangement, according to claim 1, wherein:
    a first part of the second voltage detection device is in the form of an integrated circuit; and
    said first part has a digitizing device, having an analogue-to-digital converter which digitizes the second voltage value.

3. The circuit arrangement, according claim 2, wherein:
    the regulating device is at least partially arranged in the integrated circuit.

4. A switching device, comprising:
    a circuit arrangement, according to claim 1, for actuating a power semiconductor switch, wherein:
        said power semiconductor switch has a load current input, a load current output and a control input;
        said circuit arrangement, further comprising:
            a first voltage detection device, which is able to be switched on and off, for detecting a first voltage present between the load current input and the load current output;

a second voltage detection device, which is able to be switched on and off, for detecting a second voltage present between the control input and the load current output;

a regulating device that is designed to cyclically assess a second voltage value of the second voltage and, if a second threshold value of the second voltage value is reached, to switch on the first voltage detection device, if no further fault signal is present; and further comprising a power switch in the form of a power semiconductor component or of a group of power semiconductor components connected in parallel; and wherein the respective power semiconductor component is in form of one of an IGBT, a MOSFET, and a SIC MOSFET.

5. The switching device, according to claim 4, wherein:
two power switches that each have an assigned circuit arrangement are arranged in a half-bridge topology.

6. A method, for operating a circuit arrangement, comprising the steps of:
providing a circuit arrangement, according to claim 1, for actuating a power semiconductor switch, wherein:
said power semiconductor switch has a load current input, a load current output and a control input;
said circuit arrangement, further comprising:
a first voltage detection device, which is able to be switched on and off, for detecting a first voltage present between the load current input and the load current output;
a second voltage detection device, which is able to be switched on and off, for detecting a second voltage present between the control input and the load current output;
a regulating device that is designed to cyclically assess a second voltage value of the second voltage and, if a second threshold value of the second voltage value is reached, to switch on the first voltage detection device, if no further fault signal is present;

determining a second voltage value of the second voltage by means of the second voltage detection device during the switching-on process of the power semiconductor switch; and wherein the second voltage value is cyclically compared with a second static or dynamic threshold value and, wherein, if this second threshold value is reached, the first voltage detection device is switched on if no further fault signal is present.

7. The method, according to claim 6, wherein:
the second voltage detection device is switched on only after a static or dynamic first waiting time (T1) after the start of the switching-on process of the power switch.

8. The method, according to claim 7, wherein:
the first voltage detection device is switched on only after a static or dynamic second waiting time (T2) after the second threshold value has been reached.

9. The method, according to claim 8, wherein:
the second threshold value is between 90% and 98%, of a target value of the second voltage.

10. The method, according to claim 9, wherein:
if the target value of the second voltage is exceeded by an exceedance value, then the power switch is switched to the off state by means of an output stage of the control device and a fault signal is generated.

11. The method, according to claim 10, wherein:
the exceedance value is at least 5% above the target value of the second voltage.

12. The method, according to claim 11, wherein:
the power switch is switched to the off state after a static or dynamic third waiting time (T3).

* * * * *